(12) United States Patent
Kim

(10) Patent No.: US 10,068,954 B2
(45) Date of Patent: Sep. 4, 2018

(54) ORGANIC LIGHT-EMITTING DISPLAY DEVICE

(71) Applicant: LG DISPLAY CO., LTD., Seoul (KR)

(72) Inventor: KyungMan Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/372,664

(22) Filed: Dec. 8, 2016

(65) Prior Publication Data

US 2017/0170247 A1 Jun. 15, 2017

(30) Foreign Application Priority Data

Dec. 14, 2015 (KR) .......................... 10-2015-0178070

(51) Int. Cl.
*H01L 27/32* (2006.01)
*H01L 51/52* (2006.01)
*H01L 51/56* (2006.01)

(52) U.S. Cl.
CPC ...... *H01L 27/3251* (2013.01); *H01L 27/3213* (2013.01); *H01L 27/3248* (2013.01); *H01L 51/524* (2013.01); *H01L 51/525* (2013.01); *H01L 51/5234* (2013.01); *H01L 51/5246* (2013.01); *H01L 51/56* (2013.01); *H01L 27/322* (2013.01); *H01L 27/3246* (2013.01); *H01L 27/3258* (2013.01); *H01L 51/5284* (2013.01); *H01L 2251/5315* (2013.01)

(58) Field of Classification Search
CPC ............... H01L 27/3213; H01L 27/322; H01L 27/3251; H01L 51/524; H01L 51/5246; H01L 51/525; H01L 51/5284
See application file for complete search history.

(56) References Cited

U.S. PATENT DOCUMENTS

| | | | | |
|---|---|---|---|---|
| 2007/0145887 A1* | 6/2007 | Chae | ................... | H01L 27/3253 313/504 |
| 2011/0032223 A1* | 2/2011 | Okamoto | ................ | G02F 1/167 345/204 |
| 2013/0048967 A1* | 2/2013 | Nishido | ................. | H05B 33/04 257/40 |
| 2014/0184059 A1* | 7/2014 | Masuda | .............. | H01L 51/5246 313/512 |
| 2015/0053956 A1* | 2/2015 | Sato | ..................... | H01L 51/5246 257/40 |
| 2016/0035795 A1* | 2/2016 | Lim | ...................... | H01L 27/322 257/40 |

FOREIGN PATENT DOCUMENTS

| | | |
|---|---|---|
| CN | 203589037 U | 5/2014 |
| CN | 104681577 A | 6/2015 |

* cited by examiner

*Primary Examiner* — Allan R Wilson
(74) *Attorney, Agent, or Firm* — Dentons US LLP

(57) ABSTRACT

Described herein is an organic light-emitting display (OLED) device, comprising: a first substrate comprising an array of pixels; a second substrate facing the first substrate and comprising a color layer corresponding to each pixel in the array of pixels, and comprising a black matrix separating each pixel in the array of pixels from one another; a filler layer between the first substrate and the second substrate; a side encapsulation structure between the first substrate and the second substrate along side edges thereof, wherein the side encapsulation layer is around the filler layer; and a first support on an outer portion of the side encapsulation structure on the first substrate.

17 Claims, 8 Drawing Sheets

ORGANIC LIGHT-EMITTING DISPLAY DEVICE

CROSS-REFERENCE TO RELATED APPLICATIONS

This application claims priority from Korean Patent Application No. 10-2015-0178070 filed on Dec. 14, 2015, the disclosure of which is incorporated by reference as if fully set forth herein.

BACKGROUND

Technical Field

The present disclosure relates to organic light-emitting display (OLED) devices, including an OLED device having an encapsulation structure capable of withstanding deformation and breakage.

Description of the Related Art

Display devices provide a variety of information graphically on a screen and are the core technology for information and communications dissemination. With increasing research, such display devices are becoming thinner, lighter and easier to carry, and capable of higher performance In light of such a trend, there is increasing interest in organic lightemitting display (OLED) devices, which control the amount of light emitted from an organic emission layer to display images.

An OLED device is a self-luminous device having a thin emission layer between electrodes, and thus can be made thinner In a typical OLED device, a pixel drive circuit and an organic light-emitting element are formed on a substrate, and light emitted from the organic light-emitting element passes through the substrate or a barrier layer, thereby displaying images.

The organic light-emitting element can easily deteriorate due to internal factors such as deterioration of the electrodes and the emission layer due to exposure to oxygen, deterioration due to the reaction between the emission layer and interface, and the like, as well as external factors, such as moisture, oxygen, ultraviolet rays and processing limitations of the device. Among these, performance and lifespan of the OLED device is significantly affected by oxygen and moisture, and thus packaging or encapsulation of the OLED device is an important issue.

The brightness and lifespan of a display device may be reduced, or undesirable appearance of dark spots and/or pixel shrinkage may take place, due to degradation by oxygen and/or moisture. To solve such problems, an encapsulation process for sealing an OLED device is used, in which an organic light-emitting element is deposited on a substrate and then a cover, such as a metal layer (cap or cover), a glass cap or cover, or one or more thin films or the like, seals the organic light-emitting element to block impurities from entering the OLED device. Examples of the encapsulation techniques include frit sealing, face sealing, thin film encapsulation, and the like.

SUMMARY

In view of the above, an object of the present disclosure is to provide an OLED device having an encapsulation structure capable of withstanding deformation.

Another object of the present disclosure is to provide a process for manufacturing an OLED device with an improved encapsulation structure.

It should be noted that objects of the present disclosure are not limited to the above-described objects, and other objects of the present disclosure will be apparent to those skilled in the art from the following descriptions.

An exemplary embodiment of the present disclosure is an organic light-emitting display (OLED) device, comprising: a first substrate comprising an array of pixels; a second substrate facing the first substrate and comprising a color layer corresponding to each pixel in the array of pixels, and comprising a black matrix separating each pixel in the array of pixels from one another; a filler layer between the first substrate and the second substrate; a side encapsulation structure between the first substrate and the second substrate along side edges thereof, wherein the side encapsulation layer is around the filler layer; and a first support on an outer portion of the side encapsulation structure on the first substrate.

In another exemplary embodiment, the first support is configured to maintain a distance between the first substrate and the second substrate during a process of attaching the first substrate and the second substrate.

Another exemplary embodiment further comprises a second support on the second substrate, wherein the first support faces the second support so as to suppress a deformation of the first substrate and the second substrate due to a difference in pressure during the process of attaching the first substrate and the second substrate.

In another exemplary embodiment, each of the pixels comprises: a pixel drive circuit on the first substrate, a planarization layer on the pixel drive circuit, an organic light-emitting element on the planarization layer, and a bank structure, and wherein the bank structure defines boundaries among the pixels and is configured to correspond to the black matrix.

In another exemplary embodiment, the first support is formed from the same material as that of at least of one of the planarization layer and the bank structure.

In another exemplary embodiment, the first support is formed by sequentially stacking the same materials as those of the planarization layer and the bank structure.

In another exemplary embodiment, the second support is formed by sequentially stacking the same material as that of at least one of the black matrix and the color layers.

In another exemplary embodiment, the second support is removed with an outer periphery of the second substrate after the first substrate and the second substrate are attached together.

Another exemplary embodiment further comprises a dummy dam structure disposed on an outer portion of the side encapsulation structure on the second substrate, wherein the second support is located between the dummy dam structure and the side encapsulation structure.

Another exemplary embodiment further comprises: a driver IC disposed on a portion of the first support on the first substrate on an outer side of the capsulation structure.

Another exemplary embodiment provides a method for fabricating an organic light-emitting display (OLED) device, comprising: forming an array of pixels and a first reinforcing structure on a first substrate; forming a color layer, a black matrix, and a second reinforcing structure on a second substrate; forming a side encapsulation structure and a dummy dam structure on the second substrate and providing a filler material at an inner side of the side encapsulation structure; attaching the first substrate and the second substrate; cutting a portion of the first substrate extending beyond the first reinforcing structure; and cutting a portion of the second substrate extending beyond the side encapsulation structure.

In another exemplary method, the first reinforcing structure is formed by sequentially stacking the same material as those used for the planarization layer and for a bank structure on a pixel drive circuit on the first substrate, and the second reinforcing structure is formed by sequentially stacking the same materials as those used for the color layer and for the black matrix.

In another exemplary method, the attaching the first and second substrates comprises attaching the first substrate and the second substrate in a vacuum environment with the first reinforcing structure and the second reinforcing structure facing each other.

In another exemplary method, the first reinforcing structure and the second reinforcing structure suppress bending or deforming of the first substrate and second substrate during attachment.

In another exemplary method, the cutting the portion of the second substrate comprises removing the second reinforcing structure and the dummy dam structure.

Another exemplary embodiment provides an apparatus comprising: a pair of substrates having therebetween, elements related to displaying images using emission of light; a side encapsulation structure between the pair of substrates at or near edges thereof, the side encapsulation structure comprising a wall around the elements related to displaying images; and a structure on at least one of the pair of substrates and configured to maintain a specific spacing relationship between the pair of substrates.

In another exemplary embodiment, the structure is made from the same material as that used for a planarization layer, a bank layer, or both.

In another exemplary embodiment, the structure is the remainder of a support assembly that was removed upon attachment of the pair of substrates, the structure having been within a cavity between the wall of the side encapsulation and an outer wall that temporarily surrounded the side encapsulation during a manufacturing process but removed thereafter.

In another exemplary embodiment, the structure minimized deformations at edge portions of the pair of substrates, the deformation being caused by a pressure difference between the inside and outside of the cavity during or after the attachment of the pair of substrates.

In another exemplary embodiment, the substrates, the side encapsulation, and the structure are implemented in an organic light emission diode (OLED) display device.

According to an exemplary embodiment of the present disclosure, there is provided a structure capable of avoiding a side encapsulation structure from being deformed or damaged during a process of fabricating. As a result, the OLED device according to the exemplary embodiments of the present disclosure can improve moisture proof performance and/or reliability.

Particulars of the exemplary embodiments of the present disclosure will be described in the detail description with reference to the accompanying drawings, but the present disclosure is not limited thereto.

BRIEF DESCRIPTION OF THE DRAWINGS

The above and other aspects, features and advantages of the present disclosure will be more clearly understood from the following detailed description taken in conjunction with the accompanying drawings, in which.

DETAILED DESCRIPTION OF THE PREFERRED EMBODIMENT

Figure 1:
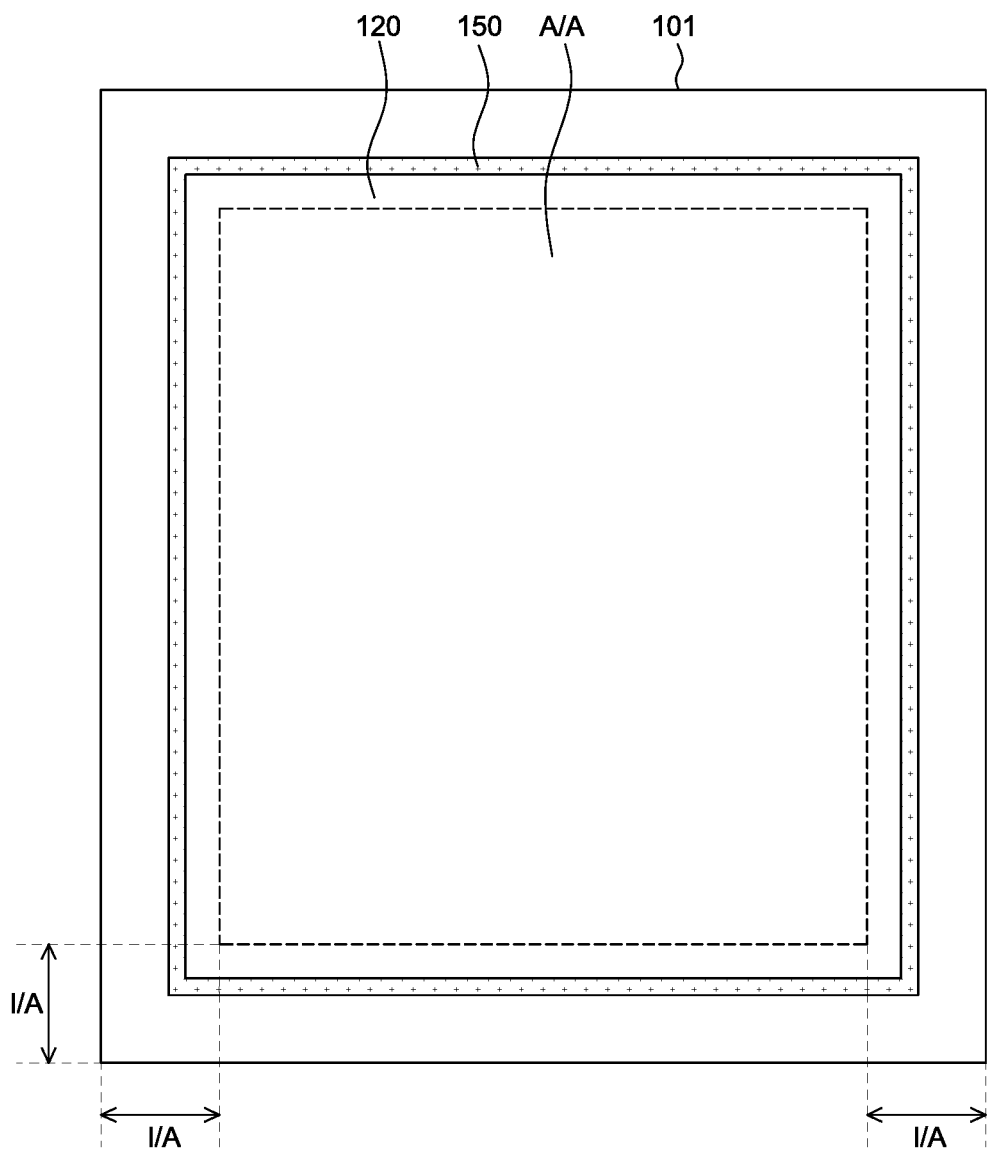
FIG. 1 is a plan view of an organic light-emitting display (OLED) device according to a first exemplary embodiment of the present disclosure.

Advantages and features of the present invention and methods to achieve them will be elucidated from exemplary embodiments described below in detail with reference to the accompanying drawings. The exemplary embodiments are provided for making the disclosure of the present disclosure thorough and for fully conveying the scope of the present disclosure to those skilled in the art. However, the present disclosure is not limited to the exemplary embodiments disclosed herein but may be implemented in various different ways. It is to be noted that the scope of the present disclosure can be defined by any appended claims, or combination thereof.

The figures, dimensions, ratios, angles and/or the identifying number of various elements of the accompanying drawings are merely illustrative and are not limiting. Like reference numerals denote like elements throughout the description. Further, in describing the present disclosure, descriptions of certain well-known technologies may be omitted in order not to unnecessarily obscure the gist of the present disclosure. It is to be noticed that the terms "comprising," "having," "including" and so on, used in the description and any appended claims, should not be interpreted as being restricted to the means listed thereafter unless specifically stated otherwise. Where an indefinite or definite article is used when referring to a singular noun, e.g. "a," "an," "the," the article includes a plural of that noun unless specifically stated otherwise. Various elements are interpreted as including error margins even without explicit statements to this effect.

In describing positional relationships, such as "an element A on an element B," "an element A above an element B," "an element A below an element B" and "an element A next to an element B," another element C may be disposed between the elements A and B unless the term "directly" or "immediately" is explicitly used. As used herein, a phrase "an element A on an element B" implies that the element A may be disposed directly on the element B and/or the element A may be disposed indirectly on the element B via another element C. As used herein, phrases "an element A connected to an element B" or "an element A coupled with an element B" implies that the element A may be directly connected to/coupled with the element B, and that another element C may be interposed between the element A and the element B, and/or that the element A may be indirectly connected to/coupled with the element B via another element C.

The terms first, second and the like in the descriptions and in the claims are used for distinguishing between similar elements and not necessarily for describing a sequential or chronological order. Accordingly, as used herein, a first element may be a second element within the technical idea of the present disclosure.

The relative dimensions of various elements in the drawings are depicted schematically and the drawing are not necessarily to scale. Hereinafter, exemplary embodiments of the present disclosure will be described in detail with reference to the accompanying drawings.

FIG. 1 is a plan view of an organic light-emitting display (OLED) device according to a first exemplary embodiment of the present disclosure.

Referring to FIG. 1, an OLED device 100 includes at least one active area A/A having an array of pixels. One or more inactive areas I/A may surround part or all of the active area. That is, the inactive areas may be adjacent to one or more sides of the active area. In FIG. 1, the inactive areas surround a rectangular active area. However, the shape of the active area and the shape/layout of the inactive areas adjacent to the active area are not limited to those shown in FIG. 1. The active area and the inactive areas may have shapes appropriate for the design of an electronic device employing the display device 100. For example, the active area may have a pentagon shape, a hexagon shape, a circular shape, an elliptical shape, etc., and the display device 100 itself may be flexible, bendable, foldable or curved.

Each of the pixels in the active area may be electrically connected to respective pixel drive circuits. Each of the pixel drive circuits may include at least one switching transistor and at least one driving transistor. Each of the pixel drive circuits may be electrically connected to gate lines and data lines so as to communicate with various elements, such as a gate driver, a data driver, and the like, which may be disposed in the inactive area or may be at least partially integrated into the active area.

The gate driver and the data driver may be implemented with thin-film transistors (TFTs) in the inactive area. The drivers may be GIPs (gate-in-panels) type drivers. In addition, some components, such as a data driver IC, may be mounted on a separated PCB and may be coupled with a connection interface (a pad, a bump, a pin, etc.) disposed in the inactive area via a circuit film, such as a FPCB (flexible printed circuit board), a COF (chip-on-film), a TCP (tape-carrier-package), and the like. The printed circuits (COF, PCB, etc.) may be disposed behind the display device 100. Again, some or all of such components could be integrated into the active area.

The OLED device 100 may include a variety of additional elements for driving pixels in the active area, such as an inverter circuit, a multiplexer, an electro static discharge circuit, and the like. The OLED device 100 may also include elements associated with features other than driving the pixels, such as, for example, for providing a touch sense feature, a user authentication feature (e.g., fingerprint recognition), a multi-level pressure sense feature, a tactile feedback feature, and the like. The above-mentioned additional elements may be disposed in the active area, inactive areas and/or an external circuit connected to the connection interface.

The OLED device according to the first exemplary embodiment of the present disclosure may include a first substrate (lower substrate or array substrate) 101, a thin-film transistor and an organic light-emitting element on the first substrate 101, a side encapsulation structure 150 disposed around the active area A/A, and a filler 120 filling the space between the active area A/A and the side encapsulation structure 150, etc. The term first substrate 110 or an array substrate may also refer to the substrate itself as well as the substrate having elements and functional layers formed thereon, e.g., a switching TFT, a driving TFT connected to the switching TFT, an organic light-emitting element connected to the driving TFT, a protective film, and the like.

The first substrate 101 supports a variety of elements of the OLED device 100. The first substrate 101 may be made of a transparent, insulative material such as glass, plastic, and the like.

The organic light-emitting element is disposed on the first substrate 101. The organic light-emitting element includes an anode, an organic emission layer formed on the anode, and a cathode formed on the organic emission layer. The organic light-emitting element may be made up of a single emission layer emitting light of a certain specific color (e.g., red, green, blue) or may be made up of a plurality of emission layers to collectively emit white light. The organic light-emitting element may be formed in the center of the first substrate 101 such that it is located in the active area. In the case wherein the organic light-emitting element emits white light, color filters may be further disposed such that red, green, or blue light (or other combinations of colors) are produced.

The passivation layer may cover the organic light-emitting element, and protects the organic light-emitting element from moisture or oxygen.

The side encapsulation structure 150 is disposed between first and second substrates along the edges thereof and blocks moisture and/or oxygen from permeating through the side surfaces of the display device 100. The side encapsulation structure 150 may also be referred to as a dam, an edge seal or a side seal.

The filler 120 fills the space between the organic light-emitting element on the first substrate 101 and the second substrate (upper substrate or encapsulation substrate). That is, the filler 120 is provided in the space between the active area A/A and the side encapsulation structure 150 between the upper and first substrate.

Figure 2:
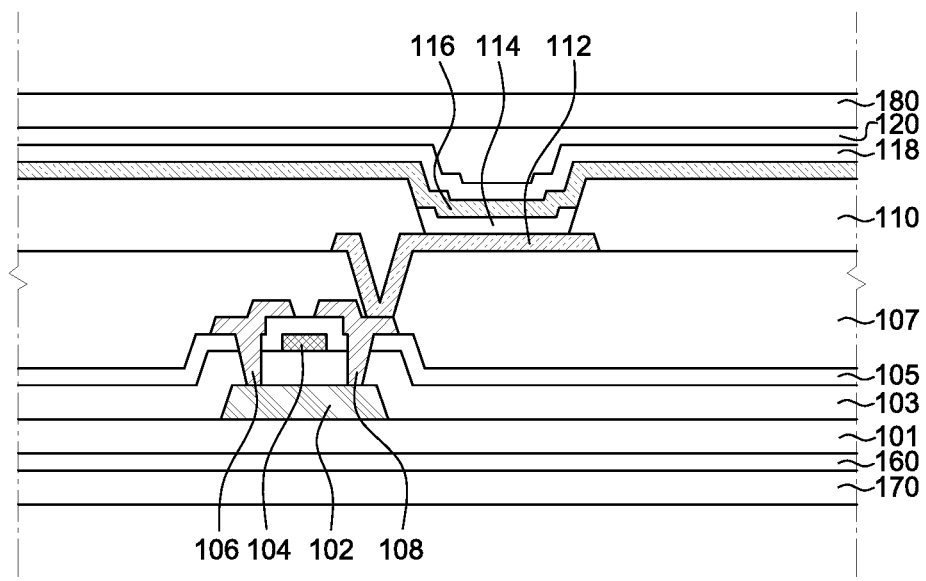
FIG. 2 is a cross-sectional view of a part of the active area of the OLED device illustrated in FIG. 1.

FIG. 2 is a cross-sectional view of a part of the active area of the OLED device illustrated in FIG. 1.

As illustrated in FIG. 2, the active area A/A includes a thin-film transistor including elements 102, 104, 106 and 108 disposed on the first substrate 101, an organic light-emitting element including elements 112, 114 and 116, and a variety of functional layers.

The first substrate 101 may be a glass or plastic substrate. For example, a plastic substrate may be made of a polyimide-based material or a polycarbonate-based material, and thus, may have flexibility.

The thin-film transistor may be formed by sequentially stacking a semiconductor layer 102, a gate insulation film 103, a gate electrode 104, an interlayer insulation film 105, and source and drain electrodes 106 and 108, respectively, on the first substrate 101.

The semiconductor layer 102 may be made of a polysilicon (p-Si) and may be partially doped with impurities. In addition, the semiconductor layer 102 may be made of amorphous silicon (a-Si) or may be made of a variety of organic semiconductor material, such as pentacene. Further, the semiconductor layer 102 may be made of an oxide semiconductor material.

The gate insulation film 103 may be formed of an insulating inorganic material, such as a silicon oxide (SiOx) and a silicon nitride (SiNx) or may be made of an insulating organic material. The gate electrode 104 may be made of a variety of conductive materials, such as magnesium (Mg), aluminum (Al), nickel (Ni), chrome (Cr), molybdenum (Mo), tungsten (W), gold (Au) or an alloy thereof.

The interlayer insulation film 105 may be formed of an insulating material such as a silicon oxide (SiOx) or a silicon nitride (SiNx) or may be made of an insulating organic material. By selectively removing the interlayer insulation film 105 and the gate insulation film 103, a contact hole may be formed via which a source region and a drain region are exposed.

The source electrode 106 and the drain electrode 108 are made of the material of the gate electrode 104 and may comprise a single layer or a plurality of layers disposed on the interlayer insulation film 105.

A planarization layer 107 may be disposed on the thin-film transistor. The planarization layer 107 protects the thin-film transistor and provides a flat surface. The planarization layer 107 may have a variety of forms. For example, the passivation layer 107 may be made of an organic insulating film, such as BCB (benzocyclobutene) and an acryl-based resin or may be made of an inorganic insulating film, such as a silicon nitride (SiNx) film or a silicon oxide (SiOx) film. In addition, the passivation layer 107 may have a single layer, a double layer, or a multi-layer structure. In certain display devices, a passivation layer may not be required because sufficient encapsulation or protection is provided by other layers or structures.

The organic light-emitting element may be formed by stacking a first electrode 112, an organic emission layer 114 and a second electrode 116 in this order on the passivation layer 107. That is, the organic light-emitting element may include a first electrode 112 formed on the passivation layer 107, an organic emission layer 114 disposed on the first electrode 112, and second electrode 116 disposed on the organic emission layer 114.

The first electrode 112 is electrically connected to the drain electrode 108 of the driving thin-film transistor via the contact hole. In such a case, if the OLED device 100 is a top-emission type device, the first electrode 112 may be made of an opaque conductive material having high reflectivity. For example, the first electrode 112 may be made of silver (Ag), aluminum (Al), gold (Au), molybdenum (Mo), tungsten (W), chrome (Cr) or an alloy thereof.

A bank 110 can be formed in the area other than an emission area. Accordingly, the bank 110 has a bank hole or opening corresponding to the emission area, via which the first electrode 112 is exposed. As such, it can be said that the bank 110 defines (or provides boundaries for) the pixels or the emission areas formed as a matrix on the substrate. The bank 110 may be made of an inorganic insulating material, such as a silicon nitride (SiNx) film or a silicon oxide (SiOx) film, or an organic insulating material such as BCB, an acryl-based resin or imide-based resin.

The organic emission layer 114 is disposed on the first electrode 112 exposed via the hole of the bank 110. The organic emission layer 114 may include an emission layer, an electron injection layer, an electron transport layer, a hole transport layer, a hole injection layer, etc. Such functional layers can be independent and distinct, or two or more layers could be combined as a result of certain functionalities being integrated in a single layer.

The second electrode 116 is disposed on the organic emission layer 114. The OLED device 100 is a top-emission type device, the second electrode 116 is made of a transparent, conductive material, such as indium tin oxide (ITO) or indium zinc oxide (IZO), such that light generated in the organic emission layer 114 exits (upwards or towards the "top") through the second electrode 116.

A passivation layer 118 may be disposed on the second electrode 116. The passivation layer 118 may be configured as an inorganic film made of glass, metal, aluminum oxide (AlOx) or a silicon (Si)-based material or may be formed by alternately stacking organic and inorganic films. The passivation layer 118 blocks entry of oxygen and moisture, thereby suppressing oxidation of the light emitting (or luminous) material and/or the material of the electrodes. If an organic light-emitting element is exposed to moisture and/or oxygen, the emission area may shrink, i.e., undesirable pixel shrinkage may occur or dark spots may appear in the emission area.

The filler 120 is disposed on the passivation layer 118 and fills the space between the passivation layer 118 and the second substrate 180. The filler 120 may be made of a material that is curable by ultraviolet rays, heat or by some other means. The material of the filler 120 may include an acryl-based resin, an epoxy-based resin, a silicon-based resin, a rubber-based resin or a mixture thereof.

The second substrate 180 faces the first substrate 101. The second substrate may be an encapsulation substrate. The lower surface of the second substrate 180 may come in contact with the filler 120. The second substrate 180 may be made of a material such as glass, polymer, metal, etc. The material of the second substrate 180 may be determined based on the direction in which the OLED device 100 emits light. In the case where the organic light-emitting element emits white light, color filters and a black matrix that is configured to partition them may be disposed on the second substrate 180.

A lower adhesive layer 160 and a lower encapsulation layer 170 are sequentially formed under the first substrate 101. The lower encapsulation layer 170 may be made of at least one organic material selected from the group consisting of: polyethylene naphthalate (PEN), polyethylene terephthalate (PET), polyethylene ether phthalate, polycarbonate, polyarylate, polyether imide, polyether sulfonate, polyimide and polyacrylate. The lower encapsulation layer 170 may suppress moisture and/or oxygen from permeating into the first substrate 101.

The lower adhesive layer 160 is made of a thermosetting or naturally-curable adhesive and attaches the first substrate 101 to the lower encapsulation layer 170. For example, the lower adhesive layer 160 may be made of an optically clear adhesive (OCA).

Figure 3:
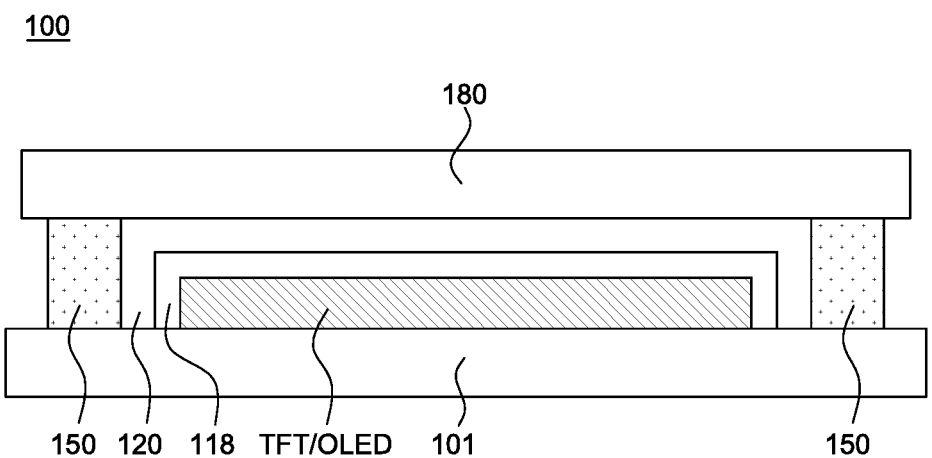
FIG. 3 is a cross-sectional view of an organic light-emitting display (OLED) device according to a second exemplary embodiment of the present disclosure.

FIG. 3 is a cross-sectional view of an organic light-emitting display (OLED) device according to a second exemplary embodiment of the present disclosure.

The OLED device 100 illustrated in FIG. 3 may include the first substrate or an array substrate 101, a pixel drive circuit and organic light-emitting element (TFT/OLED), a passivation layer 118, a side encapsulation structure 150, a filler layer 120 and a second substrate 180.

The first substrate 101 is made of an insulating material and supports a variety of elements of the OLED device 100.

The pixel drive circuit and organic light-emitting element (TFT/OLED) is disposed on the first substrate 101. The organic light-emitting element includes an anode, an organic emission layer formed on the anode, and a cathode formed on the organic emission layer. The organic emission layer may be made up of a single emission layer emitting light of a specific color (i.e. red, green, blue) or may be made up of a plurality of emission layers emitting white light (which would pass through color filter elements of red, green, blue, etc.). The organic light-emitting element may be formed in the center of the first substrate 101 such that it is located in the active area. A pixel drive circuit for driving the organic light-emitting element, i.e., a variety of elements such as thin-film transistors, capacitors, and the like, and gate and data lines may be disposed in association with the organic light-emitting element. The structure and function of the pixel drive circuit and organic light-emitting element are substantially identical to those described above with reference to FIG. 2. That is, the pixel drive circuit and organic light-emitting element TFT/OLED may refer to a layer in which data lines, gate lines, a thin-film transistor and a display element such as an organic light-emitting diode are formed.

The passivation layer 118 (if provided) covers the pixel drive circuit and organic light-emitting element TFT/OLED to suppress oxygen and/or moisture from permeating into the device. The passivation layer 118 may be made up of a plurality of layers with inorganic passivation films and organic passivation films disposed alternately. Inorganic passivation films are more effective to a blocking permeation of oxygen and/or moisture than organic passivation films. However, an organic passivation film may supplement the impact resistance characteristic of the inorganic passivation film.

The side encapsulation structure 150 blocks oxygen and/or moisture permeation through the side surfaces of the display device and/or between the two substrates. If an organic light-emitting element is exposed to moisture and/or oxygen, the emission area may shrink, or dark spots may appear in the emission area. Although FIG. 3 shows the side encapsulation structure 150 being separated from the passivation layer 118, the side encapsulation structure 150 may partially overlap an end (or a corner) of the passivation layer 118.

The filler layer 120 is formed or provided in the space between the passivation layer 118 and the second substrate 180. The filler layer 120 may also fill the space between the passivation layer 118 and the side encapsulation structure 150. The filler layer 120 may be made of a material that is curable by either ultraviolet rays, heat or both. The material of the filler layer 120 may include an acryl-based resin, an epoxy-based resin, a silicon-based resin, an olefin-based resin or a mixture thereof. The filler layer 120 may have a viscosity of approximately 1,000 to 50,000 cps and may be applied to screen printing, ink-jet printing, slot die coating, etc., The second substrate 180 is disposed on the filler layer 120. In the case where the organic light-emitting element emits white light, color filters and a black matrix configured to partition them may be disposed on the second substrate 180. The first substrate 101 on which the pixel drive circuit and organic light-emitting element (TFT/OLED) and the passivation layer 118 are disposed is aligned such that it faces the filler layer 120 disposed on the second substrate 180. Subsequently, the first substrate 101 and second substrate 180 are attached together in, for example, a vacuum environment.

Figure 4A:
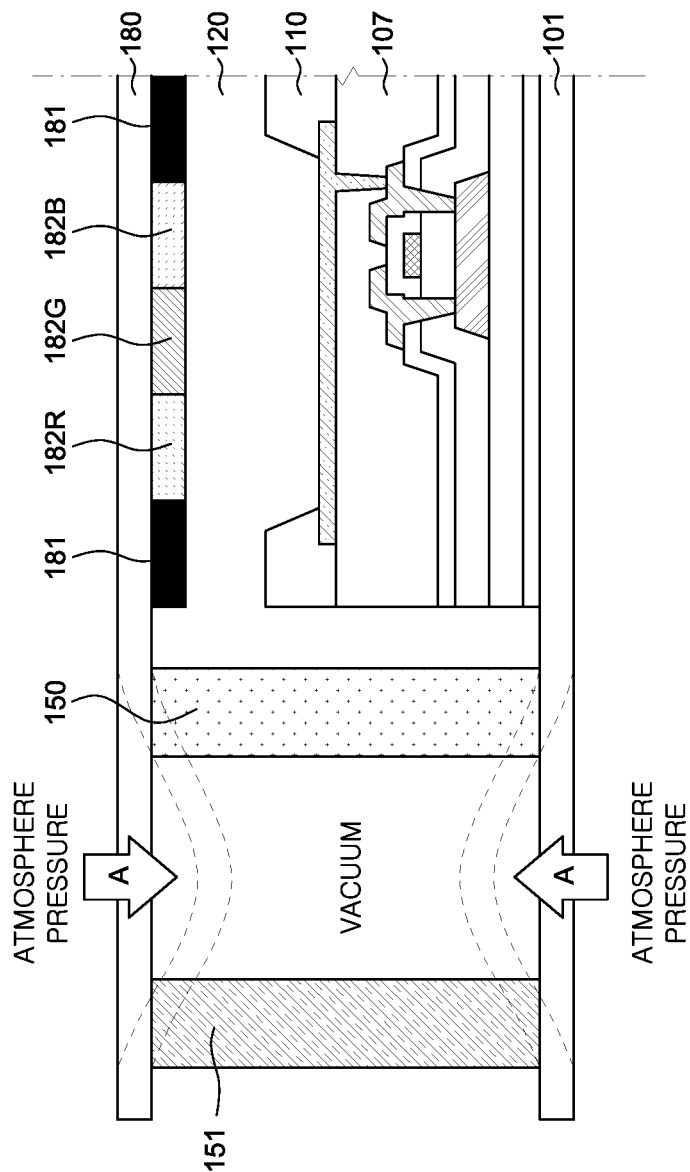
FIGS. 4A and 4B illustrate the possible defects occurring during a fabrication process of an OLED device.
Figure 4B:
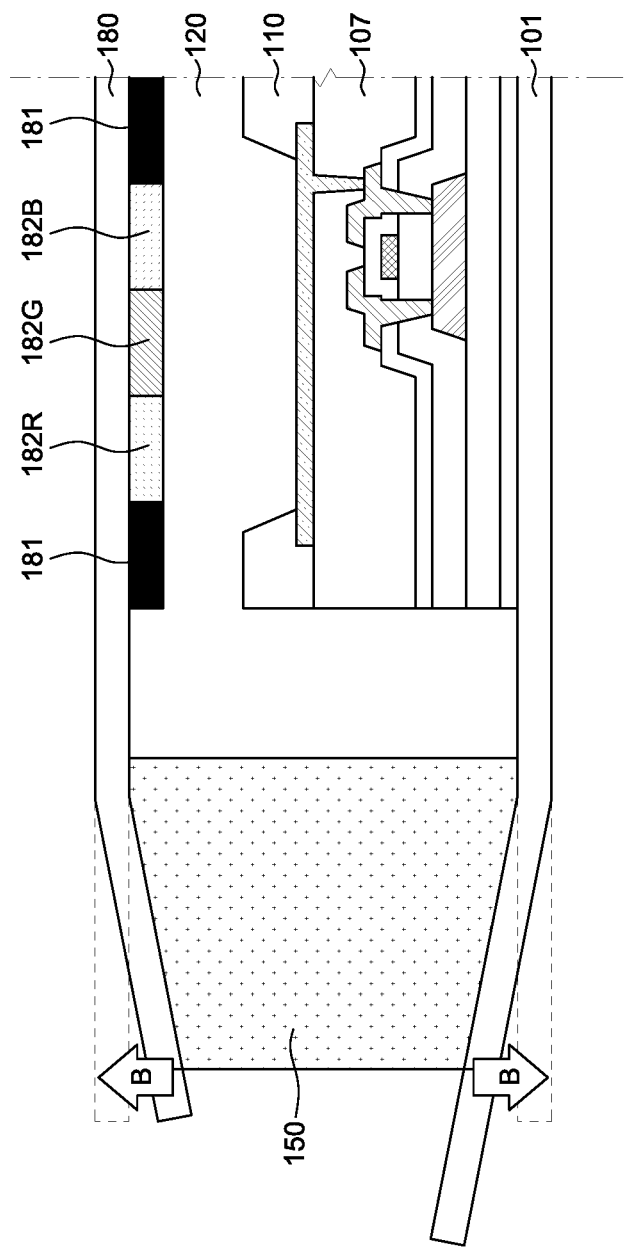

FIGS. 4A and 4B are illustrations of possible defects occurring during an OLED device fabrication process.

For a top-emission type display device, the white OLED device that includes color filters, the color filters and a black matrix partitioning them may be disposed on the second substrate 180. A plurality of pixels (with each pixel containing sub-pixels) and elements for driving the pixels (transistors, capacitors, etc.) are disposed on the first substrate 101.

During the fabrication process for an OLED device having a side encapsulation structure 150 and the filler layer 120 (a so-called dam & fill combination), the first substrate 101 and the second substrate 180 are attached together in a vacuum environment with the side encapsulation structure 150 and the filler layer 120 therebetween. In doing so, as illustrated in FIG. 4A, a dummy dam 151 (or some other equivalent structure) may support the outer portion of the side encapsulation structure 150 so that the second substrate 180 and the first substrate 101 are attached together properly while being supported. However, parts of the first and second substrates between the side encapsulation structure 150 and the dummy dam 151 are pressed, which can lead to undesired bending or deformation due to various factors, such as, a pressure difference between the atmospheric pressure A and the vacuum.

If the outer portions of the first and second substrates (which have been undesirably deformed) with respect to the side encapsulation structure 150 are cut out or removed in subsequent required processing steps, there is difference in height or thickness between the inner and sides of the side encapsulation structure 150, as shown in FIG. 4B (in an exaggerated manner merely for explanation purposes). That is, the inner side of the side encapsulation structure 150 becomes undesirably higher (or thicker) than the outer side.

As time lapses, a restoring force B works on or affects the bent substrates, such that a gap, opening, or deviation between the side encapsulation structure 150 and the first and/or second substrates is undesirably created. As a result, side moisture proof performance of the OLED device becomes poor, and the reliability of the OLED device is lowered.

Figure 5:
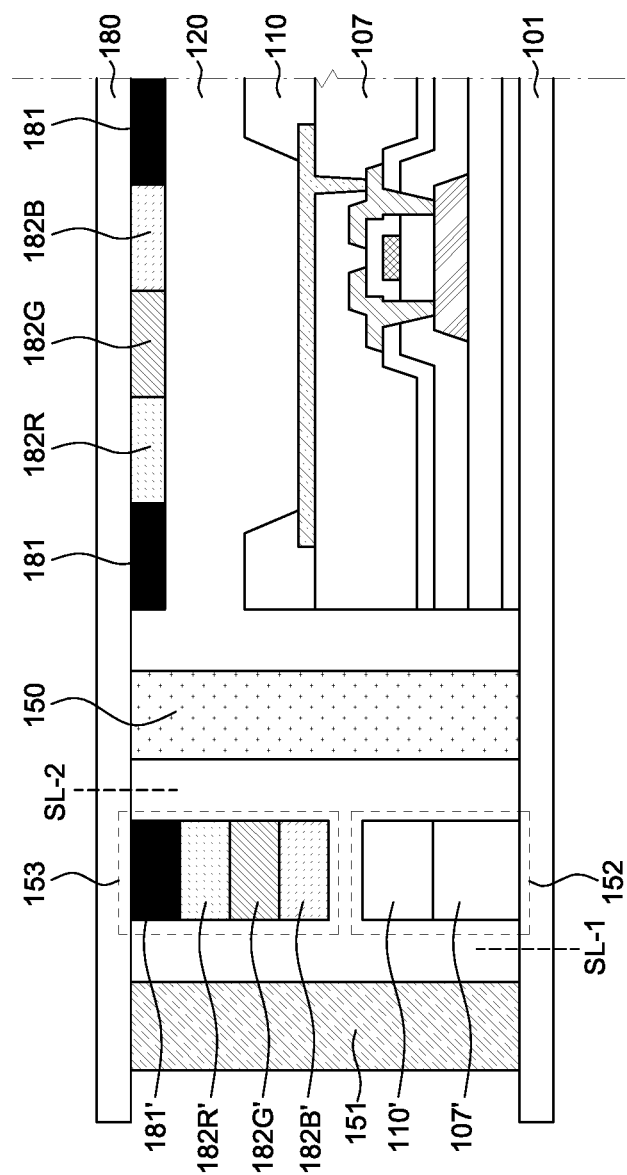
FIG. 5 is a cross-sectional view illustrating a processing step during a fabrication process of an OLED device according to a first exemplary embodiment of the present disclosure.

FIG. 5 illustrates another processing step in the OLED device fabricating process according to an exemplary embodiment of the present disclosure.

The inventors of the application have recognized the problems described above with reference to FIGS. 4A and 4B, and have devised a reinforcing structure disposed between the substrates, such as at the side encapsulation structure 150 and the dummy dam 151.

The reinforcing (supporting) structure may include a first reinforcing structure 152 and a second reinforcing structure 153. For convenience of illustration, some elements (an organic light-emitting layer, a cathode, a passivation layer, etc.) are not shown and some other elements (a TFT, etc.) are exaggerated.

The first reinforcing structure 152 (the first support) is disposed on an outer portion (e.g. along or at an edge) of the first substrate 101. Specifically, the first reinforcing structure 152 may be disposed on the outer side of the side encapsulation structure 150, i.e., between the side encapsulation structure 150 and the dummy dam 151. The second reinforcing structure 153 (the second support) is disposed on the outer portion of the second substrate 180. Specifically, the first reinforcing structure 152 may be disposed on the outer side of the side encapsulation structure 150, i.e., between the side encapsulation structure 150 and the dummy dam 151.

The first support 152 and the second support 153 face each other vertically. That is, the first support 152 and the second support 153 maintain the distance between the first substrate 101 and the second substrate 180 during the process of attaching the first substrate 101 to the second substrate 180. The first support 152 of the first substrate 101 faces the second support 153 of the second substrate 180, such that they work like a single pillar (or a wall). The first and second supports 152 and 153 are disposed to suppress the first and second substrates 101 and 180 from being bent or deformed due to differences in the pressure outside and inside the sealed cavity formed in the space between the side encapsulation structure 150 and the dummy dam 151 that seal together the first and second substrates (as described above with reference to FIG. 4A) during the process of attaching the two substrates together. The first support 152 and the second support 153 become an additional reinforcing structure between the side encapsulation structure 150 and the dummy dam 151.

The first support 152 and the second support 153 may be formed together with a variety of functional layers of a plurality of pixels when they are disposed on the first substrate 101 and/or on the second substrate 180. For example, as shown in FIG. 5, the first support 152 may be formed when the planarization layer 107 and/or the bank 110 are formed by sequentially stacking the same materials as those of the planarization layer 107 and/or the bank 110. Specifically, the lower part of the first support 152 may be formed on the outer portion of the first substrate 101 together with the planarization layer 107 when it is formed in the inner portion of the first substrate 101, and the upper part of the first support 152 may be formed together with the bank 110 when it is formed. The parts 107' and 110' of the first support 152 may have the same thickness as or a different thickness from the planarization layer 107 and the bank 110, respectively. The first support 152 may be disposed in a particular area between the side encapsulation structure 150 and the dummy dam 151. For example, the first support 152 may not be disposed in the area where external connection interfaces (e.g. pads, pins, etc.) or alignment marks are formed. The first support 152 may be spaced apart from a scribing line SL-1 by an appropriate processing margin (e.g., 400 to 800 μm). Likewise, the first support 152 may be spaced apart from the side encapsulation structure 150 by an appropriate gap. The first support 152 may be patterned in a barrier shape, a pillar shape or a variety of other shapes.

The second support 153 may be formed when a black matrix 181 and/or color layers 182R, 182G and 182B are formed by sequentially stacking the same materials as these layers. Specifically, when the black matrix 181 is formed in the inner portion of the second substrate 180, the lower part 181' of the second support 153 may be formed in the outer portion of the second substrate 180. Similarly, the layers 182R', 182G' and 182B' of the second support 153 may be formed when the color layers 182R, 182G and 182B are formed, respectively, respectively. The second support 153 may also be spaced apart from a scribing line SL-2 and the side encapsulation structure 150 by an appropriate processing margin. The second support 153 may be patterned in a barrier, a pillar or a variety of shapes.

As described above, the reinforcing structure according to the exemplary embodiment of the present disclosure can be produced with the same materials and in the same processes as the elements of the active area, and thereby significantly reducing processing time and cost.

After the first and second substrates 101 and 180 are attached together, a cutting or removing process is carried out along the scribing lines SL-1 and SL-2 (or at some other defined location), such that the dummy dam 151 and the second reinforcing structure 153 are removed together with the outer portions (ends or edges) of the two substrates. The first reinforcing structure 152 remains in an area where it does not disturb adhesion of a driver IC, as illustrated in FIG. 6, or at some location on the first substrate 101 that does not interfere with other elements.

Figure 6:
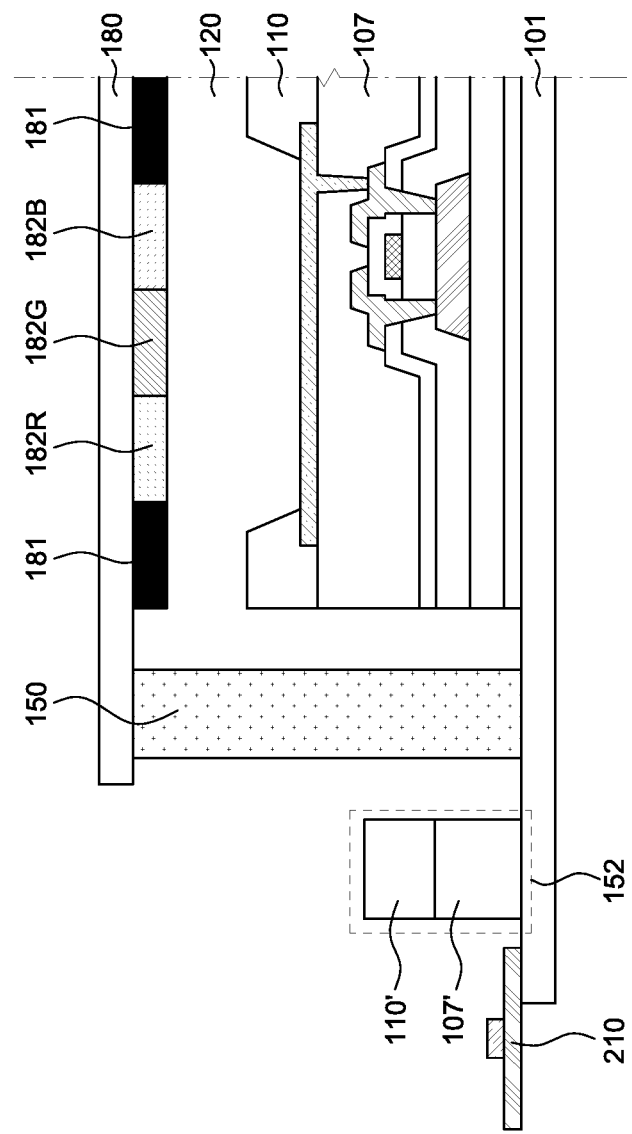
FIG. 6 is a cross-sectional view illustrating an organic light-emitting display (OLED) device according to a second exemplary embodiment of the present disclosure.

FIG. 6 is a cross-sectional view illustrating an organic light-emitting display (OLED) device according to another exemplary embodiment of the present disclosure.

The OLED device illustrated in FIG. 6 includes a first substrate (lower substrate) 101, a second substrate (upper substrate) 180, a side encapsulation structure 150, a filler layer 120, and the like. In the following description, each of the first and second substrates may refer to a support substrate as well as an assembly of elements arranged thereon. A part of reinforcing structure (first support) is disposed on the outer portion of the first substrate.

In the OLED device illustrated in FIG. 6, an array of pixels (with each pixel having a pixel drive circuit, an organic light-emitting element, etc.) is disposed on the first substrate 101. On the surface of the second substrate 180 facing the first substrate 101, R/G/B color layers 182B, 182G and 182B each corresponding to a respective pixel, and a black matrix 181 separating the pixels from one another may be disposed. The second substrate 180 acts as an encapsulation plate and also as a color filter substrate. An organic light-emitting element included in each of the pixels on the first substrate 101 may be a top-emission type organic light-emitting element that emits white light. The filler layer 120 fills the space between the first and second substrates 101 and 180. The OLED device may further include a side encapsulation structure 150 around or surrounding the filler layer 120 between the first substrate 101 and the second substrate 180. The first support 152 remains on the outer portion of the first substrate 101 extending beyond the side encapsulation structure 150, as illustrated in FIG. 6. A driver IC 210 and an interface for connecting it may also be disposed on the outer portion of the first substrate 101.

The first support 152 is specifically configured (i.e. has a particular location, height, width, etc.) so as to be used in maintaining the distance between the first substrate 101 and the second substrate 180 during the process of attaching the first substrate 101 to the second substrate 180. That is, the first support 152 faces the second support 153 (illustrated in FIG. 5) included on the second substrate 180 so as to avoid the first substrate 101 and the second substrate 180 from being bent or deformed during and/or after the process of attaching the substrates together.

The first support 152 may be formed together with a variety of functional layers of a plurality of pixels when they are disposed on the first substrate 101, as described above with respect to FIG. 5.

The second support, together with the first support 152, maintains the distance between the two substrates during the process of attaching the first and second substrates 101 and 180, and is removed together with the outer periphery of the second substrate 180 after the two substrates are attached together. The second support may be disposed between the dummy dam 151 (as illustrated in FIG. 5) and the side encapsulation structure 150.

Other descriptions of the first support 152 and the second support 153 may be identical to those described above with reference to FIG. 5.

According to the exemplary embodiments of the present disclosure described with reference to FIGS. 5 and 6, it is possible to avoid bending or deformation of the substrates, in particular the edge portions thereof, during the fabricating process. In addition, it is also possible to avoid breakage or deformation of the side encapsulation structure 150 from being deformed or broken even when the substrates are slightly bent or deformed. In this manner, the OLED device according to the exemplary embodiments of the present disclosure can have enhanced moisture-proofing performance and/or reliability. In addition, the reinforcing structure according to the exemplary embodiments of the present disclosure can be produced with the same materials and in the same processes as the elements of the active area, thereby reducing cost and simplifying the manufacturing process.

Figure 7:
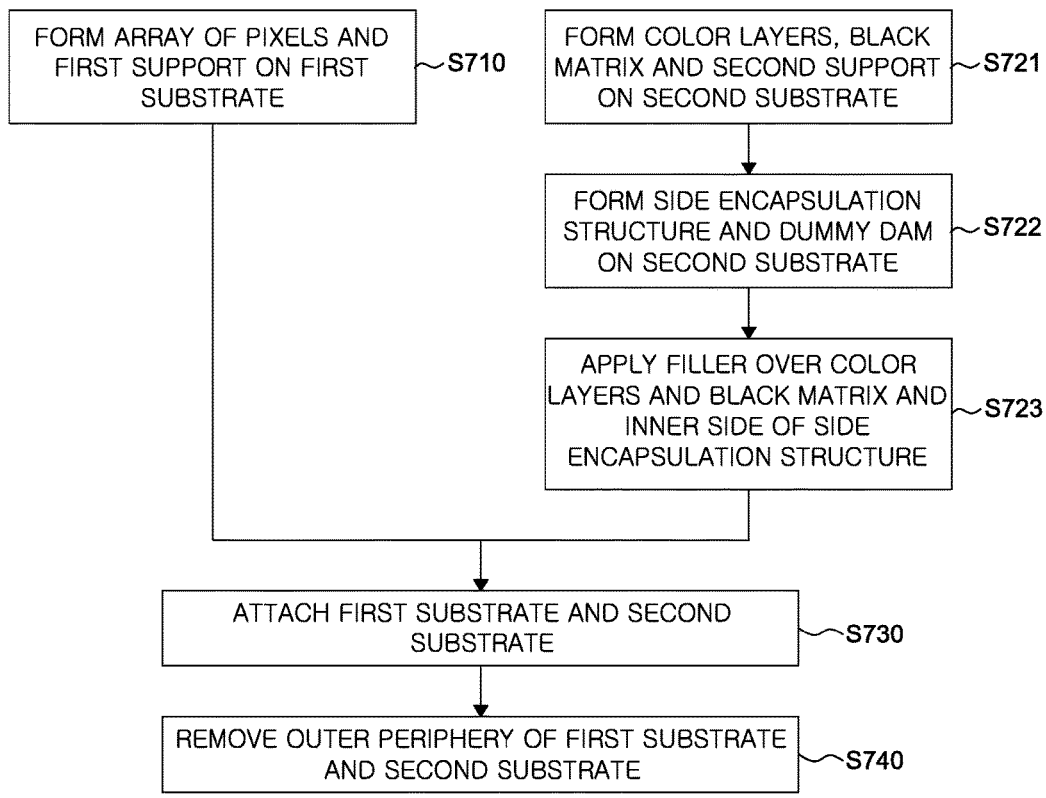
FIG. 7 is a flowchart illustrating a method for fabricating an organic light-emitting display (OLED) device according to various exemplary embodiments of the present disclosure.

FIG. 7 is a flowchart illustrating a method for fabricating an organic light-emitting display (OLED) device according to an exemplary embodiment of the present disclosure. The OLED device has the features described above with reference to FIGS. 5 and 6.

The method for fabricating the OLED device may include forming a first substrate (lower substrate) assembly, forming a second substrate (upper substrate) assembly, attaching the first substrate assembly to the second substrate assembly, and cutting the outer periphery of each of the first and second substrate assemblies.

Specifically, a process of forming an array of pixels and a first reinforcing structure (first support) on a first substrate is carried out in step S710. The first reinforcing structure may be formed by sequentially stacking the same materials as those of a planarization layer and a bank above a pixel device circuit.

Simultaneously with step S710, a process of forming color layers, a black matrix and a second reinforcing structure is carried out in step S721. The second reinforcing structure may be formed by sequentially stacking the same materials as those of the color layers and the black matrix.

Subsequently, the step S721, a process of forming a side encapsulation structure and a dummy dam (or similar structure) on the first and/or second substrate is carried out in step S722, and a process of applying a filler to the inner side of the side encapsulation structure is carried out in step S723=.

After the first substrate assembly and the second substrate assembly are prepared, a process of attaching the two substrates is carried out in step S730. The attachment process includes attaching the first and second substrates in a vacuum environment with the first reinforcing structure and the second reinforcing structure facing each other. The first reinforcing structure and the second reinforcing structure prevents the first and second substrates from being bent or deformed during and/or after the attachment process.

After the substrates are attached together, a process of cutting or removing the outer periphery (or edge portions) of the first and second substrate assemblies is carried out in step S740. Specifically, an outer portion of the first substrate with respect to the first reinforcing structure is out and an outer portion of the second substrate with respect to the side encapsulation structure are cut out. The amount of removal can be different for the first and second substrates. The second reinforcing structure and the dummy dam are also removed.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined solely by the appended claims and all equivalents thereof are construed to be within the true scope of the present disclosure.

What is claimed is:

1. An organic light-emitting display (OLED) device, comprising:
    a first substrate comprising an array of pixels;
    a second substrate facing the first substrate and comprising a color layer corresponding to each pixel in the array of pixels, and comprising a black matrix separating each pixel in the array of pixels from one another;
    a filler layer between the first substrate and the second substrate;
    a side encapsulation structure between the first substrate and the second substrate along side edges thereof, wherein the side encapsulation layer is around the filler layer; and
    a first support on an outer portion of the side encapsulation structure on the first substrate,
    wherein each of the pixels comprises a pixel drive circuit on the first substrate, a planarization layer on the pixel drive circuit, an organic light-emitting element on the planarization layer, and a bank structure, and
    wherein the first support is formed by sequentially stacking the same materials as those of the planarization layer and the bank structure.

2. The OLED device of claim 1, wherein the first support is configured to maintain a distance between the first substrate and the second substrate during a process of attaching the first substrate and the second substrate.

3. The OLED device of claim 2, further comprising a second support on the second substrate,
    wherein the first support faces the second support so as to suppress a deformation of the first substrate and the second substrate due to a difference in pressure during the process of attaching the first substrate and the second substrate.

4. The OLED device of claim 1,
    wherein the bank structure defines boundaries among the pixels and is configured to correspond to the black matrix.

5. The OLED device of claim 3, wherein the second support is formed by sequentially stacking the same material as that of at least one of the black matrix and the color layers.

6. The OLED device of claim 5, wherein the second support is removed with an outer periphery of the second substrate after the first substrate and the second substrate are attached.

7. The OLED device of claim 5, further comprising a dummy dam structure disposed on an outer portion of the side encapsulation structure on the second substrate, wherein the second support is located between the dummy dam structure and the side encapsulation structure.

8. The OLED device of claim 1, further comprising:
    a driver IC disposed on a portion of the first support on the first substrate on an outer side of the encapsulation structure.

9. A method for fabricating an organic light-emitting display (OLED) device, comprising:
    forming an array of pixels and a first reinforcing structure on a first substrate;
    forming a color layer, a black matrix, and a second reinforcing structure on a second substrate;
    forming a side encapsulation structure and a dummy dam structure on the second substrate and providing a filler material at an inner side of the side encapsulation structure;
    attaching the first substrate and the second substrate;
    cutting a portion of the first substrate extending beyond the first reinforcing structure; and cutting a portion of the second substrate extending beyond the side encapsulation structure,
wherein each of the pixels comprises a pixel drive circuit on the first substrate, a planarization layer on the pixel drive circuit, an organic light-emitting element on the planarization layer, and a bank structure, and
wherein the first reinforcing structure is formed by sequentially stacking the same materials as those of the planarization layer and the bank structure.

10. The method of claim 9, wherein
the second reinforcing structure is formed by sequentially stacking the same materials as those used for the color layer and for the black matrix.

11. The method of claim 10, wherein the attaching the first and second substrates comprises attaching the first substrate and the second substrate in a vacuum environment with the first reinforcing structure and the second reinforcing structure facing each other.

12. The method of claim 11, wherein the first reinforcing structure and the second reinforcing structuresuppress bending or deforming of the first substrate and second substrate during attachment.

13. The method of claim 9, wherein the cutting the portion of the second substrate comprises removing the second reinforcing structure and the dummy dam structure.

14. An apparatus comprising:
a pair of substrates having therebetween, elements related to displaying images using emission of light;
a side encapsulation structure between the pair of substrates at or near edges thereof, the side encapsulation structure comprising a wall around the elements related to displaying images; and
a structure on at least one of the pair of substrates and configured to maintain a specific spacing relationship between the pair of substrates,
wherein the structure is formed by sequentially stacking the same materials as that used for a planarization layer and a bank layer.

15. The apparatus of claim 14, wherein the structure is the remainder of a support assembly that was removed upon attachment of the pair of substrates, the structure having been within a cavity between the wall of the side encapsulation and an outer wall that temporarily surrounded the side encapsulation during a manufacturing process but removed thereafter.

16. The apparatus of claim 15, wherein the structure minimized deformations at edge portions of the pair of substrates, the deformation being caused by a pressure difference between the inside and outside of the cavity during or after the attachment of the pair of substrates.

17. The apparatus of claim 16, wherein the substrates, the side encapsulation, and the structure are implemented in an organic light emission diode (OLED) display device.

* * * * *